United States Patent
Grivna et al.

(10) Patent No.: US 6,984,860 B2
(45) Date of Patent: Jan. 10, 2006

(54) SEMICONDUCTOR DEVICE WITH HIGH FREQUENCY PARALLEL PLATE TRENCH CAPACITOR STRUCTURE

(75) Inventors: Gordon M. Grivna, Mesa, AZ (US); Irene S. Wan, Phoenix, AZ (US); Sudhama C. Shastri, Phoenix, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/305,773

(22) Filed: Nov. 27, 2002

(65) Prior Publication Data

US 2004/0099898 A1 May 27, 2004

(51) Int. Cl.
*H01L 27/108* (2006.01)

(52) U.S. Cl. .................... 257/301; 257/296; 257/300; 257/303

(58) Field of Classification Search ................ 257/301, 257/300, 305, 296, 303

See application file for complete search history.

(56) References Cited

U.S. PATENT DOCUMENTS

| | | | | |
|---|---|---|---|---|
| 4,918,503 A | * | 4/1990 | Okuyama | .................... 257/301 |
| 5,021,842 A | * | 6/1991 | Koyanagi | .................... 257/305 |
| 5,214,496 A | * | 5/1993 | Sunami et al. | ............... 257/296 |
| 5,624,865 A | * | 4/1997 | Schuegraf et al. | ........... 438/396 |
| 5,866,452 A | | 2/1999 | Willer et al. | |
| 5,945,704 A | | 8/1999 | Schrems et al. | |
| 6,117,726 A | | 9/2000 | Tsai et al. | |
| 6,259,149 B1 | * | 7/2001 | Burkhardt et al. | ........... 257/534 |
| 6,268,620 B1 | | 7/2001 | Ouellet et al. | |
| 6,410,397 B1 | | 6/2002 | Ochiai et al. | |
| 6,417,063 B1 | | 7/2002 | Petter et al. | |
| 6,437,385 B1 | * | 8/2002 | Bertin et al. | ................. 257/301 |
| 6,455,886 B1 | | 9/2002 | Mandelman et al. | |
| 2003/0228848 A1 | * | 12/2003 | Escoffier et al. | ............... 455/91 |

* cited by examiner

*Primary Examiner*—Minhloan Tran
*Assistant Examiner*—Tan Tran
(74) *Attorney, Agent, or Firm*—Kevin B. Jackson

(57) ABSTRACT

A semiconductor device (10) is formed on a semiconductor substrate (12) whose surface (24) is formed with a trench (18). A capacitor (20) has a first plate (22) formed over the substrate surface with first and second portions lining first and second sidewalls (25) of the trench, respectively. A second plate (35, 38) is formed over the first plate and extends into the trench between the first and second portions.

18 Claims, 4 Drawing Sheets

SEMICONDUCTOR DEVICE WITH HIGH FREQUENCY PARALLEL PLATE TRENCH CAPACITOR STRUCTURE

BACKGROUND OF THE INVENTION

The present invention relates in general to semiconductor devices and, more particularly, to integrated circuits formed with high frequency bypass capacitors.

Manufacturers of cellular telephones and other wireless communication devices are requiring integrated circuits with an increased number of passive components in order to reduce the fabrication cost and/or the physical size of the communications devices. One such type of discrete passive component is bypass capacitors, which are connected between power supply terminals to smooth out voltage spikes and other disturbances on a power supply, and also to provide low pass filter applications.

So far, many semiconductor manufacturers have had difficulty in integrating bypass capacitors on a semiconductor die along with other components because of their large electrical value or their low performance when integrated. In cellular telephones and other wireless communication devices, bypass capacitors must have a value of one nanofarad or more and be able to filter signals operating at frequencies of six gigahertz or more. Attempts to integrate bypass capacitors have resulted in components that occupy a large die area, which results in a high equivalent series resistance (ESR) and consequent poor frequency response. Moreover, the die area adds a substantial cost to manufacture the capacitors.

Hence, there is a need for an integrated circuit that is formed with a bypass capacitor having a large value and low ESR in order to achieve a high frequency response while maintaining a low cost.

DETAILED DESCRIPTION OF THE DRAWINGS

In the figures, elements having the same reference number have similar functionality.

Figure 1:
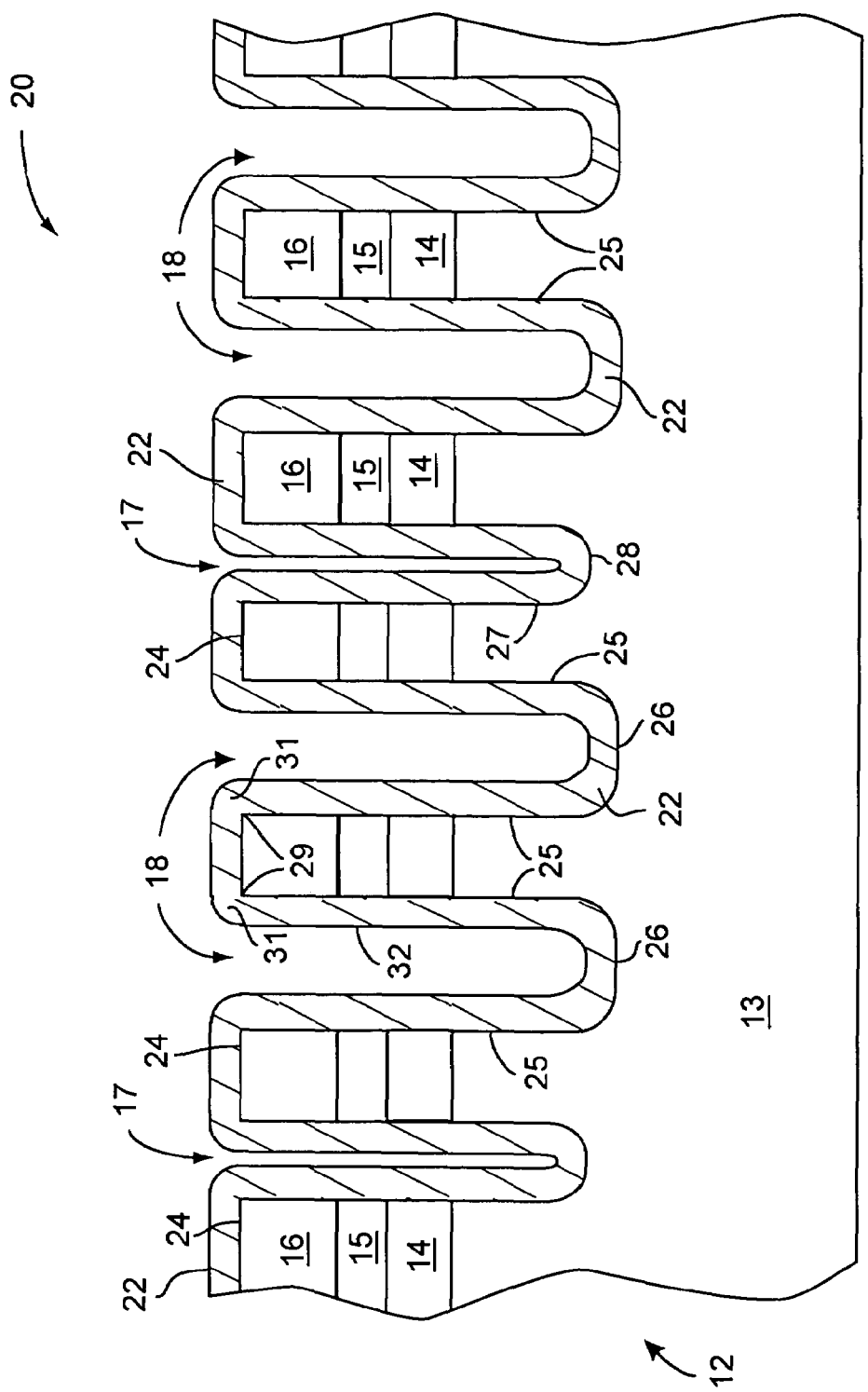
FIG. 1 is a cross-sectional view of a semiconductor device formed with a capacitor after a first fabrication stage.

FIG. 1 is a cross-sectional view showing a semiconductor device 10 formed on a semiconductor substrate 12 and including a capacitor 20 after a first stage of processing. In one embodiment, substrate 12 is formed with monocrystalline silicon and semiconductor device 10 is formed as an integrated circuit operating at frequencies between about one gigahertz and about six gigahertz for use in a wireless communications device. In one embodiment, capacitor 20 operates as a power supply filter or bypass capacitor having a capacitance of at least one nanofarad.

A base layer 13 is heavily doped to provide a low resistance ground plane for high frequency signals present in capacitor 20 and other portions pf semiconductor device 10. In one embodiment, base layer 13 comprises monocrystalline silicon doped with boron atoms to have a p-type conductivity and a resistivity of about 0.1 ohm-centimeters. In one embodiment, base layer 13 is biased to operate at ground potential.

An epitaxial layer 14 is grown on base layer 13 to have a p-type conductivity and a relatively high resistivity. The high resistivity provides a low parasitic substrate capacitance for transistors (not shown) formed on substrate 12 to achieve an overall high frequency of operation of semiconductor device 10. In one embodiment, epitaxial layer 14 has a thickness of about 2.75 micrometers and a doping concentration of about $10^{14}$ atoms/centimeter$^3$.

A buried layer 15 is formed over epitaxial layer 14 to provide a low collector resistance path for bipolar NPN transistors (not shown) and a low base resistance for bipolar PNP transistors (not shown) formed on substrate 12 and integrated with capacitor 20 as part of semiconductor device 10. In one embodiment, buried layer 15 is implanted to have an n-type conductivity, a thickness of about one micrometer and a doping concentration of about $6.0*10^{19}$ atoms/centimeter$^3$.

An epitaxial layer 16 is grown over buried layer 15 to a thickness of about 0.8 micrometers. In one embodiment, epitaxial layer 16 has an n-type conductivity and a doping concentration of $2.0*10^{16}$ atoms/centimeter$^3$, approximately.

Figure 3:
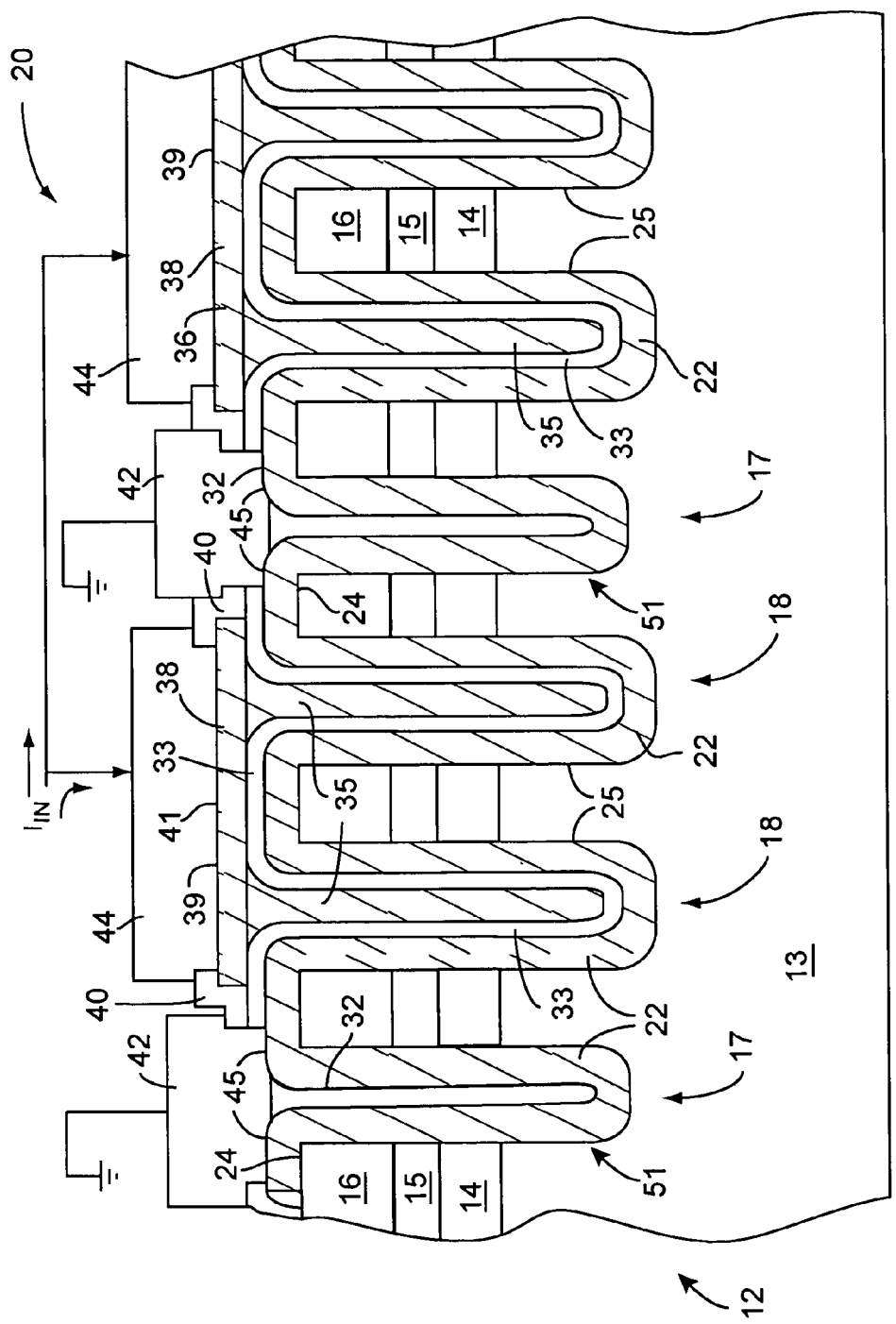
FIG. 3 is a cross-sectional view of the semiconductor device after a third fabrication stage.
Figure 4:
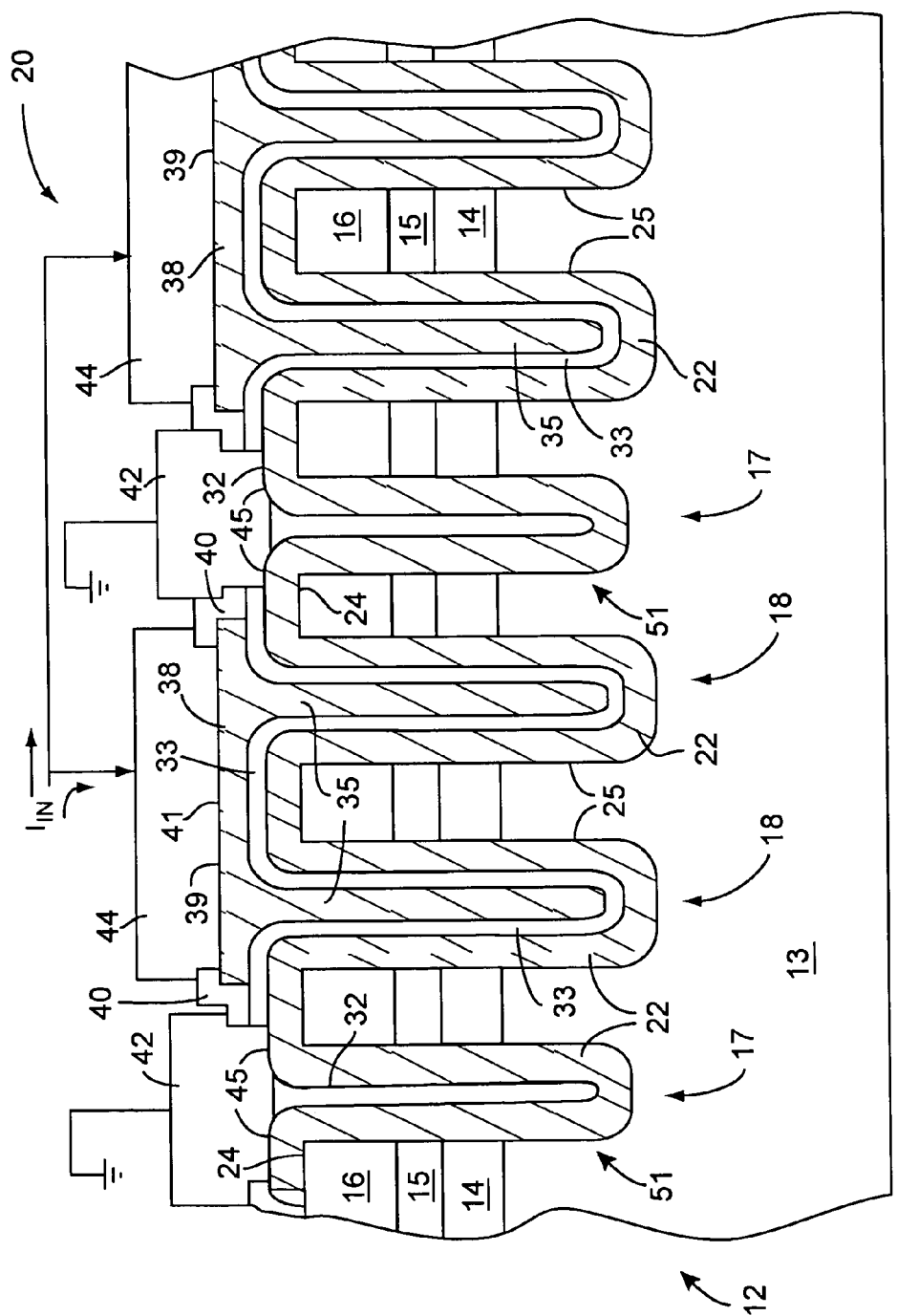
FIG. 4 is a cross-sectional view of an alternative embodiment of the semiconductor device after a third fabrication stage.

A plurality ot trenches 17 are etched in a surface 24 of substrate 12 to a depth sufficient to reach base layer 13 to form substrate contacts 51 (shown in FIGS. 3 and 4). In one embodiment, trenches 17 are formed to a depth of about seven micrometers and have a width of about one micrometer.

Concurrently, a plurality of trenches 18 are etched in surface 24 for subsequently forming plates of capacitor 20. In one embodiment, trenches 18 are formed to a depth of about eight micrometers and have a width of about 1.5 micrometers. In one embodiment, trenches 18 have a greater width than trenches 17, and therefore are more quickly etched, which, given their concurrent formation, accounts for the somewhat greater depth of trenches 18.

A conformal conductive layer 22 is disposed over surface 24 and patterned in the region of capacitor 20 to cover sidewalls 25 and bottom surfaces 26 of trenches 18, thereby forming a first plate of capacitor 20. Conductive layer 22 also lines sidewalls 27 and bottom surfaces 28 of trenches 17 as shown.

Conformal films such as conductive layer 22 have a substantially constant thickness regardless of the underlying contours on which they are formed. Conductive layer 22 is formed as a conformal film in order to avoid thinning over steep vertical steps such as those present at upper corners 29 of trenches 18. Hence, conductive layer 22 is formed with a substantially constant radius in regions 31 adjacent to corners 29.

Conductive layer 22 typically is made using a process such as chemical vapor deposition (CVD), plasma-enhanced CVD, or plating, which provides good step coverage and a uniform thickness on most if not all surface topographies. CVD processes currently are commercially available for depositing a variety of conductive materials such as tungsten, polycrystalline silicon, copper, aluminum, and the like, or combinations thereof, any of which could provide a suitable material for layer 22. In one embodiment, conductive layer 22 is formed with polycrystalline silicon heavily doped with boron atoms to have a p-type conductivity, a thickness of about four thousand angstroms, and a low sheet resistance. For example, in one embodiment, the doping concentration of a polycrystalline silicon conductive layer 22 may be on the order of $10^{20}$ atoms/centimeter$^3$. The radial thickness of conductive layer 22 in regions 31 preferably is within about ten percent of its thickness over planar surfaces such as surface 24 and/or sidewalls 25. The conformal nature and substantially uniform thickness of conductive layer 22 over all underlying contours provides capacitor 20 with a uniform capacitance, a high breakdown voltage and a low equivalent series resistance (ESR) that produces a high frequency response. Moreover, films subsequently deposited over an outer surface 32 of conductive layer 22 are more easily formed to a uniform thickness, thereby ensuring these advantages over a specified range of processing variations.

Conductive layer 22 is formed along sidewalls 25 of trenches 18 and has the same p-type conductivity, and therefore makes an ohmic electrical contact with base layer 13. Layer 22 typically is doped to a level near the solubility limits of boron to function as a dopant source in which boron atoms diffuse from layer 22 into layers 13–16 to further reduce the effective resistivity of base layer 13 and the ESR of capacitor 20. Using conductive layer 22 as a doping source reduces the resistance of lightly doped epitaxial layer 14 and is readily extended to provide capacitors with a low equivalent series resistance and high frequency response in virtually any application, including one in which base layer 13 is lightly doped rather than heavily doped.

Figure 2:
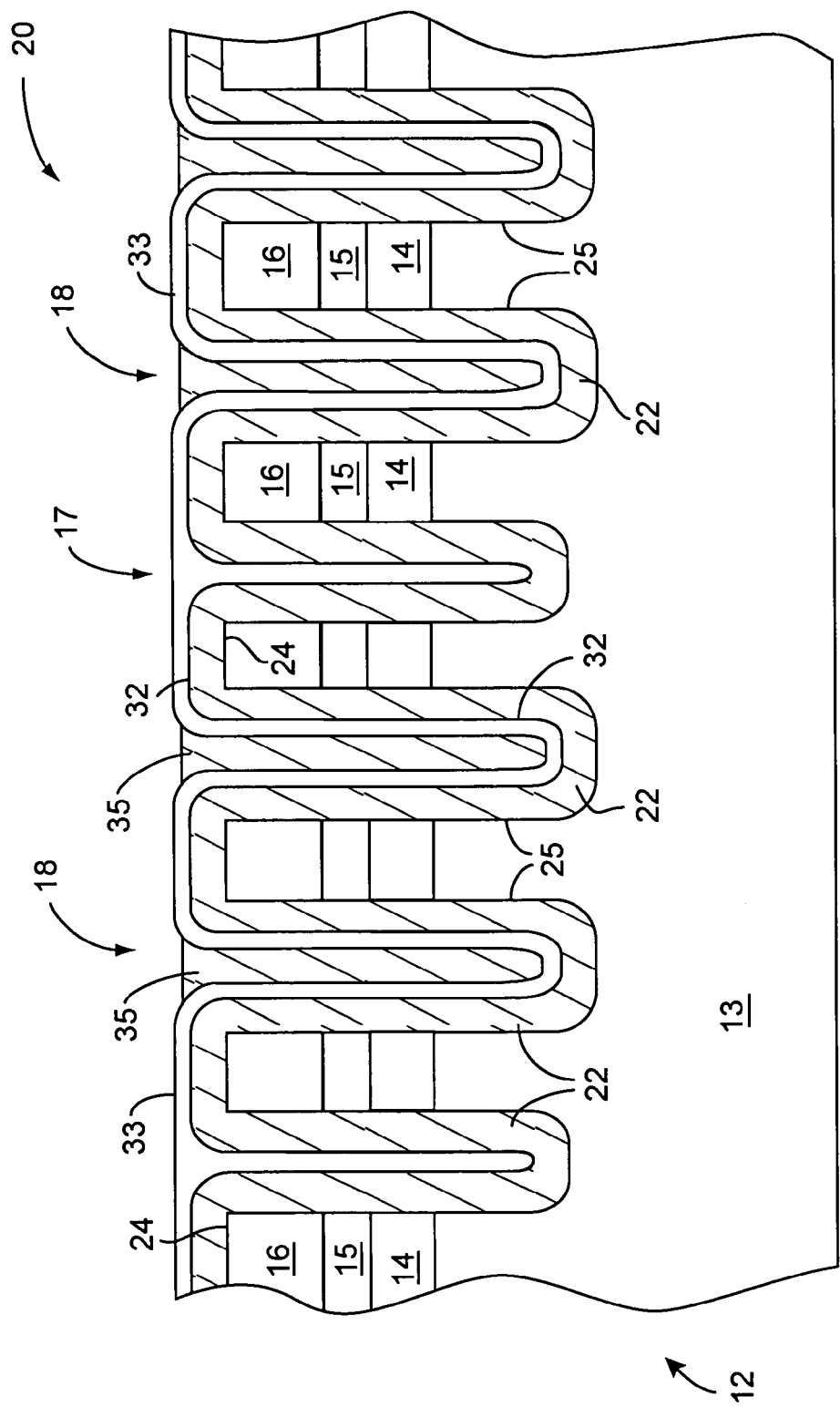
FIG. 2 is a cross-sectional view of the semiconductor device after a second fabrication stage.

FIG. 2 is a cross-sectional view of semiconductor device 10 after a second stage of fabrication.

A dielectric film 33 is formed over outer surface 32 to function as a capacitor dielectric. Dielectric film 33 is grown or deposited using a conformal process that results in a constant thickness over all of the underlying topographies of semiconductor device 10. The constant thickness of dielectric film 33 is facilitated by the conformal nature of conductive layer 22, whose outer surface 32 is smoother than the contours underlying its inner surface. In one embodiment, dielectric film 33 comprises silicon nitride deposited to a thickness in a range between about forty and about six hundred angstroms, with a typical thickness of about four hundred angstroms. In an alternative embodiment, dielectric film 33 is formed as a dielectric stack consisting of, for example, an oxide-nitride stack or an oxide-nitride-oxide stack. In yet another alternative embodiment, dielectric film 33 may be formed with alumina, tantalum pentoxide, halfnium oxide, or other high permittivity dielectrics or combinations thereof.

A conductive layer 35 is formed over dielectric film 33, also preferably in a conformal fashion, to function as a second plate of capacitor 20. Conductive layer 35 may be formed with the same material as that of conductive layer 22, although it need not be so. The component of equivalent series resistance attributable to conductive layer 35 preferably is low in order to provide a high frequency capability. In one embodiment, conductive layer 35 comprises polycrystalline silicon with a p-type conductivity and a doping concentration of about $10^{20}$ atoms/centimeter$^3$. In one embodiment, layer 35 is deposited using a CVD process to a thickness of about four thousand angstroms.

In one embodiment, a blanket etch back process removes conductive layer 35 from regions overlying surface 24 and leaves portions within trenches 18 that may be recessed to a level somewhat lower than the upper surface of dielectric film 33. If trenches 17 are sufficiently narrow, there is little or no space left within trenches 17 for material from conductive layer 35 to be deposited.

FIG. 3 is a cross-sectional view of integrated circuit 10 after a third stage of fabrication. Conductive film 22 is patterned and etched to form a bottom plate of capacitor 20.

A conductive film 36 is disposed over dielectric film 33 and then patterned and etched to form plates 38 that contact exposed portions of conductive layer 35 near the openings of trenches 18 as shown. In one embodiment, plates 38 are formed with undoped polycrystalline silicon deposited to a thickness of about one thousand eight hundred angstroms and then patterned and doped to have a p-type conductivity suitable for forming resistors, transistor electrodes and other components (not shown) of semiconductor device 10.

In an alternate embodiment, the above described blanket planarization etch step and the deposition of conductive film 36 are omitted. Instead, conductive layer 35 is patterned and selectively etched to form plates 38 as a continuous extension of the portions within trenches 18 as shown in FIG. 4. Dielectric film 33 and conductive layer 22 are then patterned and etched as shown.

A dielectric film 40 is then formed over plates 38. In one embodiment, dielectric film 40 comprises silicon nitride deposited to a thickness of about five hundred angstroms and silicon dioxide deposited to a thickness of about six thousand angstroms.

Dielectric film 40 is then patterned and an etch is applied to remove selected portions of dielectric films 33 and 40, thereby exposing outer surface 32 of conductive film 22 in regions 45 adjacent to trenches 17. The etch further exposes surfaces 39 of plates 38.

Active devices such as transistors (not shown), as well as other components (not shown) then may be formed on semiconductor device 10. Hence, capacitor 20 is essentially fully completed prior to the formation of critical components such as transistors. Consequently, the capacitor 20 fabrication has little if any impact on the overall thermal budget used to form critical active devices and other components.

Portions of capacitor 20 that are within trenches 18, where dielectric film 33 lies between conductive layers 22 and 35, are referred to as trench portions. Portions in regions 41, where plates 38 are separated from conductive layer 22 by dielectric film 33, are referred to as surface portions. The overall capacitance produced by capacitor 20 includes both the surface and trench portions, which results in an efficient use of die area, a high overall capacitance per unit area and low fabrication cost.

An interconnect metallization film is deposited and patterned to form electrodes 42 and 44 of capacitor 20. Electrodes 42 contact conductive layer 22 in regions 45, thereby providing a structure for making electrical contact to a first plate of capacitor 20. Electrodes 44 contact plates 38 in regions 41, thereby providing a structure for making electrical contact to a second plate of capacitor 20.

The operation of capacitor 20 proceeds as follows. Electrodes 42 are coupled together out of the view plane of FIG. 3 and typically operate at ground potential, which grounds one plate of capacitor 20 as well as base layer 13. Electrodes 44 are coupled together out of the view plane of FIG. 3 and receive a signal that includes a current signal $I_{IN}$ having an alternating current component that operates at frequencies between about one gigahertz and about six gigahertz. In one embodiment, $I_{IN}$ represents noise, switching currents or other disturbances on a terminal that supplies power for biasing semiconductor device 20.

Current signal $I_{IN}$ is routed through electrodes 44 to plates 38, which overlies surface 24 and serves as a portion of one plate of capacitor 20. Current signal $I_{IN}$ is further routed to conductive layer 35, which is formed within trench 18 and serves as a second portion of the plate. Current signal $I_{IN}$ is capacitively coupled through dielectric film 33 to conductive layer 22, which is formed on surface 24 and sidewalls 25 to function as the other plate of capacitor 20, to filter out or reduce the amplitude of the alternating current component. Signal $I_{IN}$ is effectively routed from electrodes 44 through the parasitic resistive paths that include conductive layers 22 and 35, plates 38 and/or base layer 13 to electrodes 42, which operate at ground potential. The resistive paths have a low resistance due to their heavy doping, which provides a high frequency capability.

In summary, the present invention provides a semiconductor device and capacitor structure suitable for integration in a variety of technologies. The semiconductor substrate has a surface formed with a trench, and the capacitor has a first plate formed over the substrate surface with first and second portions lining sidewalls of the trench. A second plate of the capacitor is formed over the first plate and extends into the trench between the first and second portions.

The capacitor's plates typically are formed in a plurality of trenches arranged to optimize the tradeoff between die area and frequency response. That is, if a high frequency response is desired, more substrate contact trenches are formed in order to reduce the resistance in the capacitor's current paths, thereby producing a low ESR. The substrate contact trenches provide parallel resistive paths for capacitor currents to flow, and the more such paths the lower the resistance and greater the die area. In one embodiment, the trenches are formed with a length of about one hundred micrometers with one substrate contact trench provided for each capacitor trench to achieve a frequency response of more than ten gigahertz.

The above described capacitor structure can produce large capacitances of one nanofarad or more in a small die area, thereby achieving a low cost. The use of a conductive layer to line the trenches produces a constant capacitance as a function of plate voltage by preventing depletion of the adjacent monocrystalline semiconductor layer. The surface layout of the capacitor can be formed as an array of rows or a matrix of cells, or can be circular, serpentine or virtually any other shape. As a result, the capacitor can be laid out on a semiconductor die between other devices or adjacent to sensitive subcircuits to minimize the capacitor's area or maximize its value for a given available die area. Moreover, the capacitor can be formed prior to the formation of active devices, so the thermal cycles used to form the capacitor have little or no effect on the thermal budget allocated to fabricating the active devices.

What is claimed is:

1. A semiconductor device, comprising:
   a semiconductor substrate having a substrate surface formed with a plurality of adjacent trenches;
   a capacitor formed in the plurality of adjacent trenches, the capacitor including a continuous first conductive layer formed over the substrate surface and lining sidewalls of the plurality of adjacent trenches to provide a first plate, a dielectric film formed over the first plate of the capacitor, and a second conductive material formed over the dielectric, wherein the second conductive material fills the plurality of adjacent trenches, and wherein the second conductive material in the plurality of adjacent trenches is directly coupled together to form a second plate of the capacitor; and
   a trench substrate contact, wherein the continuous first conductive layer lines sidewalls of the trench substrate contact, and wherein the trench substrate contact is formed absent the second conductive material.

2. The semiconductor device of claim 1, wherein the capacitor has a capacitance of at least one nanofarad.

3. The semiconductor device of claim 1, wherein the dielectric film comprises silicon nitride.

4. The semiconductor device of claim 3, wherein the dielectric film has a thickness in a range between about forty and about six hundred angstroms.

5. The semiconductor device of claim 1, wherein the dielectric film extends over the first conductive layer above the substrate surface.

6. The semiconductor device of claim 1, wherein the first plate is formed with polycrystalline silicon.

7. The semiconductor device of claim 6, wherein the second plate is formed with polycrystalline silicon.

8. The semiconductor device of claim 7, wherein the semiconductor substrate comprises a base layer of a first conductivity type.

9. The semiconductor device of claim 8, wherein the first plate is doped to have the first conductivity type for providing an ohmic contact with the base layer.

10. The semiconductor device of claim 1, further comprising a metallization layer formed over the substrate surface and electrically contacting the trench substrate contact.

11. The semiconductor device of claim 1, wherein the first plate has a first thickness along the sidewalls and a second thickness substantially equal to the first thickness over the substrate surface.

12. The semiconductor device of claim 11, wherein the substrate surface and a sidewall intersect at a corner and the first plate has a third thickness at the corner that is substantially equal to the first and second.

13. The semiconductor device of claim 1, wherein a third conductive layer directly couples the second conductive material in the plurality of adjacent trenches together.

14. An integrated circuit, comprising:
   a substrate having a substrate surface for defining a plurality of trenches;
   a first conductive material disposed from the substrate surface along surfaces of the plurality of trenches, wherein the first conductive material is continuous between at least two trenches;
   a second conductive material formed within the plurality of trenches and extending to the substrate surface;
   a conductive layer directly coupling the second conductive material in adjacent trenches together; and
   a dielectric formed within the plurality of trenches between the first and second conductive materials to provide a capacitance between the first and second conductive materials.

15. The integrated circuit of claim 14, wherein a portion of the first conductive material is formed to overlie the substrate surface.

16. The integrated circuit of claim 15, wherein a portion of the dielectric is formed over the portion of the first conductive material.

17. The integrated circuit of claim 16, wherein a portion of the dielectric is formed over the substrate surface between the portions of the first and second conductive materials.

18. The integrated circuit of claim 14, further comprising a trench substrate contact, wherein the first conductive material covers sidewalls and a bottom surface of the trench substrate contact, and wherein the trench substrate contact is formed absent the second conductive material.

* * * * *